United States Patent [19]

Hasegawa

[11] Patent Number: 4,977,570
[45] Date of Patent: Dec. 11, 1990

[54] SEMICONDUCTOR LASER ARRAY WITH STRIPE ELECTRODES HAVING PADS FOR WIRE BONDING

[75] Inventor: Mitsutoshi Hasegawa, Yokohama, Japan

[73] Assignee: Canon Kabushiki Kaisha, Tokyo, Japan

[21] Appl. No.: 492,363

[22] Filed: Mar. 9, 1990

Related U.S. Application Data

[63] Continuation of Ser. No. 292,313, Dec. 30, 1988, abandoned.

[30] Foreign Application Priority Data

Jan. 13, 1988 [JP] Japan .................................. 63-003781

[51] Int. Cl.$^5$ .............................................. H01S 3/19
[52] U.S. Cl. ........................................ 372/50; 372/44; 372/97
[58] Field of Search ....................... 372/50, 97, 23, 43, 372/44

[56] References Cited

U.S. PATENT DOCUMENTS 4,369,513 1/1983 Umeda et al. ......................... 372/50
4,799,229 1/1989 Miyazawa et al. .................... 372/50

FOREIGN PATENT DOCUMENTS 2169134 7/1986 United Kingdom .................. 372/50

Primary Examiner—Georgia Epps
Attorney, Agent, or Firm—Fitzpatrick, Cella, Harper & Scinto

[57] ABSTRACT

A semiconductor laser array comprising plural semiconductor layers formed on a substrate having a laser active layer. The plural semiconductor layers define first and second end-faces which are for emitting laser light. Plural stripe-like current injection areas are also formed in the plural semiconductor layers. Each two adjacent current injection areas have a respective first distance therebetween at the first end-face, and each two adjacent current injection areas have a respective second distance therebetween at the second end-face,- the first distance being greater than the second distance. Plural electrodes are provided for supplying current to the current injection areas. At least one of the electrodes has a stripe-like portion formed corresponding to the current injection areas, and has a pad portion which has a width greater than that of the stripe-like portion. The pad portion is for wire bonding, and is formed in an area other than the current injection areas.

6 Claims, 5 Drawing Sheets ion Ser. No. 07/292,313 filed Dec. 30, 1988 now abandoned.

SEMICONDUCTOR LASER ARRAY WITH STRIPE ELECTRODES HAVING PADS FOR WIRE BONDING

This application is a continuation of application Ser. No. 07/292,313 filed Dec. 30, 1988 now abandoned.

BACKGROUND OF THE INVENTION

1. Field of the Invention

The present invention relates to a semi-conductor laser array in which plural semiconductor laser elements are monolithically formed on a same substrate.

2. Related Background Art

In the conventional semiconductor laser array, as shown in FIG. 1, stripe electrodes 61d-65d are formed in parallel manner, respectively in current injection areas 61a-65a of semiconductor laser elements 61-65. These stripe electrodes are independently connected to a power source by wire bondings 20.

For the purpose of reducing the pitch of the elements in such semiconductor laser array, in case of two elements, the wire bondings are made on both sides of two current injection areas as shown in FIG. 2. Also in case of three or more elements, there is employed three-dimensional wiring as shown in FIG. 3.

However, if the pitch of the semiconductor laser elements in such array becomes smaller than for example the effective width of the wire bonding, which is about 100 μm, the wire bonding operation has to be conducted very precisely and therefore the electrodes can become very easily shortcircuited. Also the wire bonding, if conducted on the current injection area of the laser, may cause damage in the laser element. Such damage may shorten the service life of the laser element or deteriorates the electrical properties, thus eventually destructing the laser element and lowering the production yield.

Also in three-dimensional wiring, the electrodes are often shortcircuited due to through holes in the insulating film or destruction of the insulating film caused by the impact at the wire bonding, so that the production yield is lowered.

Thus, in the conventional laser array with three or more laser elements with the pitch of elements equal to or smaller than 100 μm, it has been difficult to achieve independent driving of the semiconductor elements, or to achieve a high level of integration of the semiconductor laser element, and such laser array has been associated with a low production yield at the mounting.

SUMMARY OF THE INVENTION

The object of the present invention is to provide a semiconductor laser array not associated with the above-mentioned drawbacks of the prior technology, capable of achieving a high level of integration and facilitating the wire bonding operation.

The foregoing object can be achieved, according to the present invention, by a semiconductor laser array, comprising:

a single substrate; and plural semiconductor laser elements monolithically formed on said single substrate, wherein each of said semiconductor laser elements comprises:

plural semiconductor layers including a laser active layer;

first and second end faces formed by said plural semiconductor layers and adapted for emitting laser light; and plural stripe electrodes for current supply to said laser active layer, wherein said electrodes have a pitch at said first end face different from the pitch thereof at said second end face, and at least one of said electrodes has a wire bonding pad for wire bonding with a width larger than the other part of the electrodes.

DESCRIPTION OF THE PREFERRED EMBODIMENT

Now the semiconductor laser array of the present invention will be clarified in detail by the embodiments thereof shown in the attached drawings.

Figure 1:
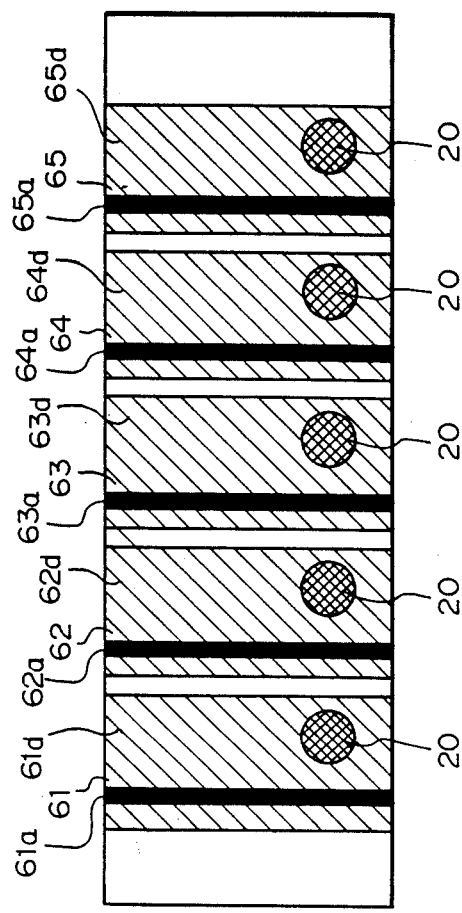
FIGS. 1 to 3 are plan views of examples of conventional semiconductor laser array.
Figure 2:
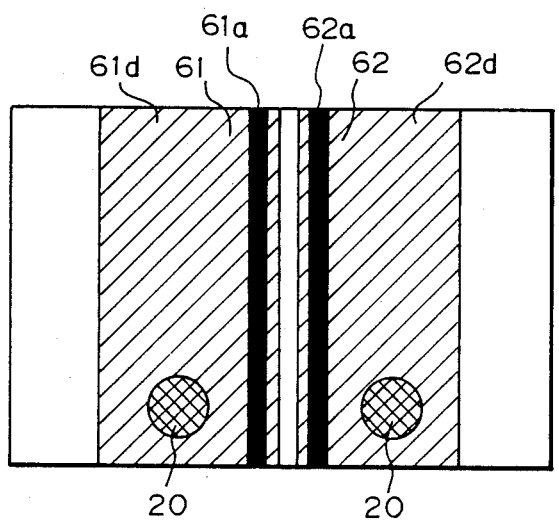
Figure 3:
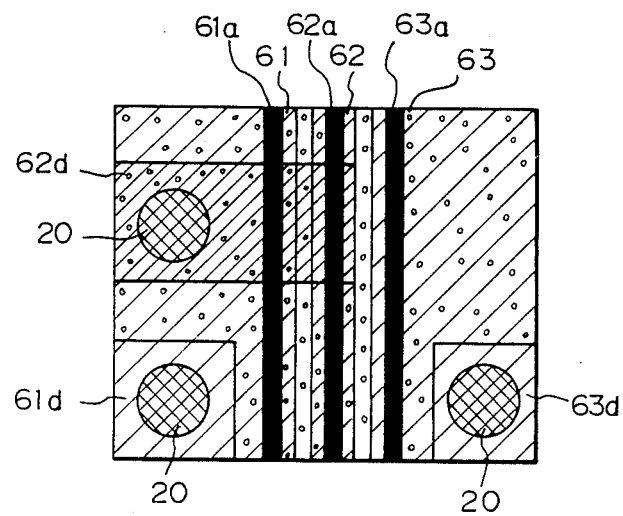
Figure 4:
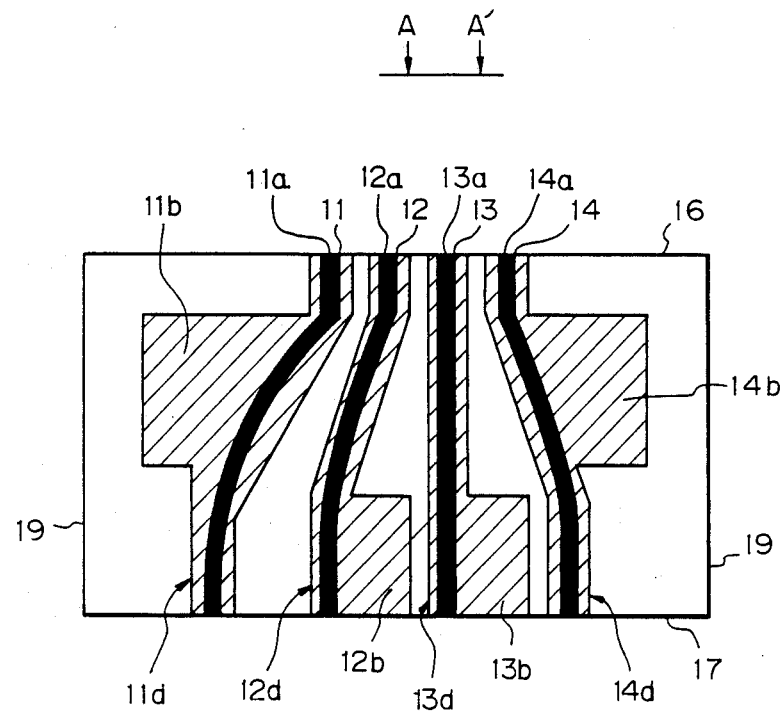
FIG. 4 is a plan view of an embodiment of the semiconductor laser array of the present invention.

FIG. 4 is a plan view showing an embodiment of the semiconductor laser array of the present invention, wherein semiconductor laser elements 11-14 have a pitch on a resonance plane 16 different from that on another resonance plane 17. The semi-conductor laser elements 11-14 respectively have current injection areas 11a-14a, corresponding to light-emitting areas. Also there are provided stripe electrodes 11d-14d respectively having pads for wire bonding 11b-14b. For facilitating the wire bonding operation, the pads are formed wider than the other part of the electrodes. The resonance planes 16, 17 are formed by cleavage.

Figure 5:
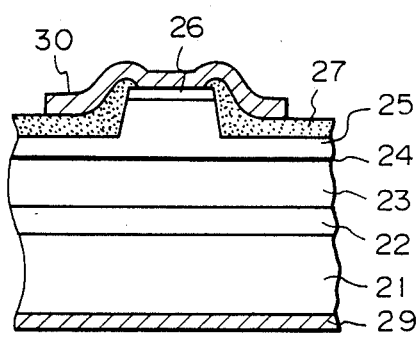
FIG. 5 is a schematic cross-sectional view of an element in the array shown in FIG. 4.

FIG. 5 is a cross-sectional view of a laser element, along a line A—A' in FIG. 4. In the following there will be explained the manufacturing process of the laser array in detail, with principal reference to FIG. 5.

On an n—GaAs substrate 21, there are laminated, in succession an n—GaAs buffer layer 22 of a thickness of 1 μm, an n—Al$_{0.4}$Ga$_{0.6}$As clad layer 23 of a thickness of 2 μm, an active layer consisting of four cycles of a non-doped GaAs layer of a thickness of 100 Å and a non-doped Al$_{0.2}$Ga$_{0.8}$As layer of a thickness of 30 Å, and finally a GaAs layer of a thickness of 100 Å, thereby forming an active area 24 of a multiple quantum well structure. Then a p—Al$_{0.4}$Ga$_{0.6}$As clad layer 25 of a thickness of 15 μm and a GaAs cap layer 26 of a thickness of 0.5 μm were prepared by molecular beam epitaxy.

Then, in order to limit the current injection area, the above-mentioned laminate structure is etched to a level about 0.4 μm in front of the active layer 24 except a stripe-shaped area, thereby forming a ridge. On the ridge there is formed a silicon nitride insulating film 27 by plasma CVD method, and the film 27 is etched off only in the top of the ridge thereby forming an injection area for contact with the electrode.

The injection area has a width of 2.5 μm, and the p-type and n-type may naturally be exchanged for the four stripes in order to obtain the same effects.

Then a Cr—Au ohmic upper electrode 30 is formed, and is separated by etching to obtain four independent electrodes 11d-14d as shown in FIG. 4.

The GaAs substrate 21 is lapped to a thickness of 100 μm, and is subjected to deposition of an Au—Ge electrode as a n-ohmic electrode 29.

After a subsequent thermal treatment for diffusion, the resonance planes as shown in FIG. 4 are made by cleavage. Planes 19 are prepared by scribing. The pitch of the laser elements is 15 and 150 μm respectively on the resonance planes 16, 17. The electrodes 11d-14d are independently connected to a power source by unrepresented lead wires bonded to the pads 11b-14b. The length of the cavity, or the distance between the resonance planes 16, 17 is 300 μm.

The semiconductor laser array thus prepared can achieve independent driving of the semi-conductor laser elements with a high level of integration.

Figure 6:
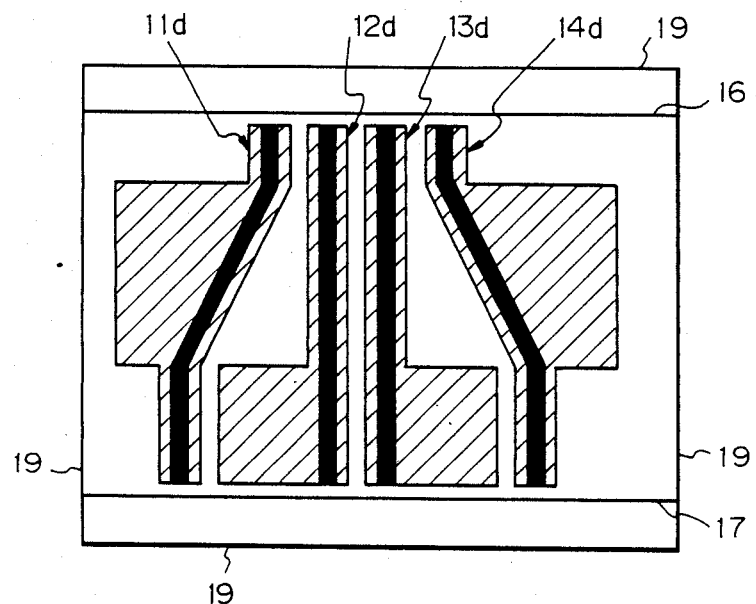
FIGS. 6 to 8 are plan views of other embodiments of the present invention.
Figure 7:
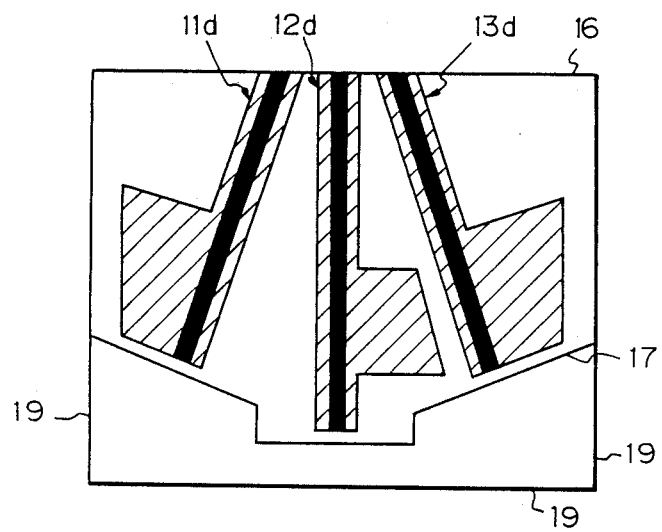
Figure 8:
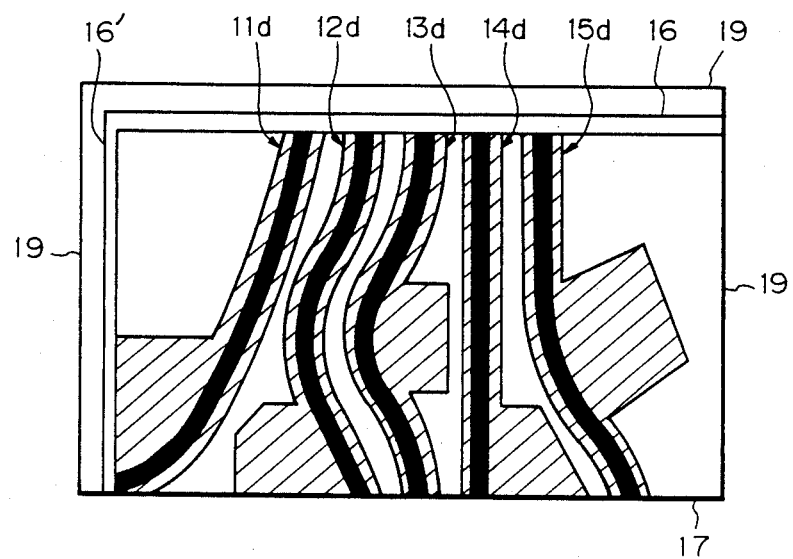

In the foregoing embodiment the resonance planes are prepared by cleavage, but there may also be employed a resonance plane prepared by a wet etching process or a dry etching process for one or both of the resonance planes. FIGS. 6 to 8 are plan views showing such example, in which same components as those in FIG. 4 are represented by same numbers and will not be explained further.

A semiconductor laser array shown in FIG. 6 is different from that shown in FIG. 4 in that four end planes of the substrate are formed by scribing, and the resonance planes 16, 17 are formed by etching. Also in a semiconductor laser array shown in FIG. 7, the stripe electrodes 11d-13d are formed with a non-zero mutual angle in order that the laser elements have respectively different light-emitting directions. The resonance plane 16 is prepared by cleavage, while the resonance plane 17 is prepared by etching so as to be perpendicular to the longitudinal direction of each stripe electrode. Such laser array emitting plural laser beams in different directions is detailedly explained in the Japanese Laid-open Patent 61-120486, the Japanese Laid-open Patent 61-159785 (corresponding to the U.S. patent application Ser. No. 797,492; filed: Nov. 13, 1985) and U.S. Pat. No. 4,799,229.

In a semiconductor laser array shown in FIG. 8, a resonance plane 16' is formed also on the lateral side of the array. Stripe electrodes 11d-15d are curved, and plural laser beams are emitted in mutually different directions.

As explained in the foregoing, the present invention has the advantages of enabling independent drive of a monolithic laser array of a small pitch, achieving a high level of integration of the monolithic laser array, and improving the production yield at the mounting. Such monolithic laser array with independently drivable laser elements of a small pitch is extremely useful as a light source for an optical pickup such as for an optical disk or a optical card, as the plural laser elements can be used for independent purposes.

The present invention is not limited to the foregoing embodiments but is subject to various other applications. For example, the length of cavity or the width of current injection area need not be same for all the semiconductor laser elements. Also the active area is formed, in the foregoing embodiments, by the multiple quantum well structure, but the present invention is applicable also to other structures such as the laser of double hetero structure or single quantum well structure.

Furthermore, though the foregoing description has been limited to the ridge wave structure utilizing GaAs, the present invention is applicable also to the laser of refractive index wave guide type, such as the buried hetero structure, the channeled substrate planar structure or the structure having an absorption layer for current constriction in the vicinity of the active layer, or the laser of gain wave guide type such as the proton bombard structure.

The material for the semiconductor laser elements is not limited to GaAs or AlGaAs series, but there may be employed other materials such as InP, InGaAsP or AlGaInP series.

Also the semiconductor laser array of the present invention may employ not only the lasers with Fabry-Perot oscillator but also the distributed feedback (DFB) lasers or distributed Bragg reflection (DBR) lasers.

The present invention includes all these modifications as long as they are within the scope of the appended claims.

I claim:

1. A semiconductor laser array comprising:
   a substrate;
   plural semiconductor layers formed on said substrate, said plural layers comprising a laser active layer;
   first and second end-faces defined by said plural semiconductor layers, for emitting laser light;
   plural stripe-like current injection areas formed in at least one of said plural semiconductor layers, each two adjacent ones of said current injection areas having a respective first distance therebetween at said first end-face and having a respective second distance, less than the respective first distance therebetween at said second end-face; and
   plural electrodes for supplying current to said current injection areas, at least one of said electrodes having a stripe-like portion formed corresponding to said current injection areas, and having a pad portion which has a width greater than a width of said stripe-like portion, said pad portion being for wire bonding, wherein said pad portion is formed in an area other than said current injection areas.

2. A semiconductor laser array according to claim 1, wherein said current injection areas are arranged, in the longitudinal direction, at non-zero angles to each other.

3. A semiconductor laser array according to claim 1, wherein said current injection areas are curved.

4. A semiconductor laser array comprising:
   a substrate;
   plural semiconductor layers formed on said substrate, said plural layers comprising a laser active layer;
   first and second end-faces defined by said plural semiconductor layers, for emitting laser light;
   plural stripe-like current injection areas formed in at least one of said plural semiconductor layers, each two adjacent ones of said current injection areas having a respective first distance therebetween at said first end-face and having a respective second distance, less than the respective first distance therebetween at said second end-face; and
   plural electrodes for supplying current to said current injection areas, at least one of said electrodes having a stripe-like portion formed corresponding to said current injection areas, and having a pad portion which has a width greater than a width of said stripe-like portion so as to be connected to an external power source, wherein said pad portion is formed in an area other than said current injection areas.

5. A semiconductor laser array according to claim 4, wherein said current injection areas are arranged, in the longitudinal direction, at non-zero angles to each other.

6. A semiconductor laser array according to claim 4, wherein said current injection areas are curved.

* * * * *